United States Patent
Ohashi

(10) Patent No.: US 8,053,776 B2
(45) Date of Patent: Nov. 8, 2011

(54) VERTICAL DIODE AND METHOD FOR MANUFACTURING SAME AND SEMICONDUCTOR MEMORY DEVICE

(75) Inventor: Takuo Ohashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 12/617,650

(22) Filed: Nov. 12, 2009

(65) Prior Publication Data

US 2010/0163821 A1    Jul. 1, 2010

(30) Foreign Application Priority Data

Dec. 26, 2008  (JP) .................. 2008-334483

(51) Int. Cl.
 *H01L 29/04* (2006.01)
 *H01L 21/20* (2006.01)
(52) U.S. Cl. .............. 257/64; 257/65; 257/E29.237; 257/E29.003; 257/E29.004; 257/E29.327; 257/E21.09; 438/488
(58) Field of Classification Search ............ 257/64, 257/65, E21.09, E29.003, E29.004, E29.327
See application file for complete search history.

(56) References Cited

U.S. PATENT DOCUMENTS

| | | | | |
|---|---|---|---|---|
| 4,675,715 A * | 6/1987 | Lepselter et al. | ................ | 257/51 |
| 5,213,628 A * | 5/1993 | Noguchi et al. | ............... | 136/255 |
| 5,441,904 A * | 8/1995 | Kim et al. | ..................... | 438/592 |
| 6,835,632 B2 * | 12/2004 | Shimamoto et al. | .......... | 438/382 |
| 2003/0124818 A1 * | 7/2003 | Luo et al. | ....................... | 438/482 |
| 2005/0224838 A1 * | 10/2005 | Tanaka et al. | .................. | 257/187 |
| 2008/0111133 A1 * | 5/2008 | Ahn | ............................... | 257/64 |

FOREIGN PATENT DOCUMENTS

| | | |
|---|---|---|
| JP | 2000-232073 | 8/2000 |
| JP | 2002-329641 | 11/2002 |
| JP | 2005-064487 | 3/2005 |
| JP | 2008-085071 | 4/2008 |

* cited by examiner

*Primary Examiner* — Victor A Mandala
(74) *Attorney, Agent, or Firm* — Finnegan, Henderson, Farabow, Garrett & Dunner, L.L.P.

(57) ABSTRACT

In a vertical diode, an $N^+$-type layer, an $N^-$-type layer, and a $P^+$-type layer are stacked in this order on a lower electrode film, and an upper electrode film is provided thereon. The effective impurity concentration of the $N^-$-type layer is lower than the effective impurity concentrations of the $N^+$-type layer and the $P^+$-type layer. At least one of the $N^+$-type layer, the $N^-$-type layer, and the $P^+$-type layer is formed from a small grain size polycrystalline semiconductor whose each crystal grain does not penetrate each layer through its thickness.

20 Claims, 16 Drawing Sheets

VERTICAL DIODE AND METHOD FOR MANUFACTURING SAME AND SEMICONDUCTOR MEMORY DEVICE

CROSS-REFERENCE TO RELATED APPLICATIONS

This application is based upon and claims the benefit of priority from the prior Japanese Patent Application No. 2008-334483, filed on Dec. 26, 2008; the entire contents of which are incorporated herein by reference.

BACKGROUND OF THE INVENTION

1. Field of the Invention

This invention relates to a vertical diode with an N-type layer and a P-type layer stacked therein and a method for manufacturing the same and a semiconductor memory device based on this vertical diode.

2. Background Art

Semiconductor memory devices including memory cells integrated on a semiconductor substrate have been conventionally developed. For instance, as such a semiconductor memory device, JP-A 2008-085071 (Kokai) discloses a ReRAM (Resistance Random Access Memory). The memory device disclosed in JP-A 2008-085071 (Kokai) includes a plurality of word lines extending in a first direction and a plurality of bit lines extending in a second direction. A resistance change element is connected between each word line and each bit line, and the resistance value of this resistance change element is used to store information. In this memory device, a thin-film diode is connected between the word lines and the resistance change element or between the bit lines and the resistance change element so that no current flows in the non-selected word lines and bit lines.

On the other hand, in semiconductor memory devices, memory cells have been downscaled for higher capacity and lower cost. However, in view of the limit of lithography technology, further downscaling may instead lead to cost increase. Hence, recently, stacking memory cells to increase integration density has come under consideration.

In the aforementioned ReRAM, to stack memory cells, the thickness of the thin-film diode needs to be decreased in view of processing issues and the like. However, in the thin-film diode with a small thickness, it is extremely difficult to satisfy both a low forward resistance and a high reverse breakdown voltage.

SUMMARY OF THE INVENTION

According to an aspect of the invention, there is provided a vertical diode including: a first semiconductor layer of a first conductivity type; a second semiconductor layer provided on the first semiconductor layer; and a third semiconductor layer of a second conductivity type provided on the second semiconductor layer, the second semiconductor layer having a lower effective impurity concentration than the first semiconductor layer and the third semiconductor layer, and at least one of the first semiconductor layer, the second semiconductor layer, and the third semiconductor layer being made of a semiconductor of a polycrystal whose crystal grain does not penetrate through its thickness.

According to another aspect of the invention, there is provided a method for manufacturing a vertical diode, including: forming a stacked body on an electrode film, the stacked body including a first semiconductor layer doped with first conductivity type impurity, a second semiconductor layer, and a third semiconductor layer doped with second conductivity type impurity stacked in this order, the second semiconductor layer having a lower effective impurity concentration than the first semiconductor layer and the third semiconductor layer, and at least one of the first semiconductor layer, the second semiconductor layer, and the third semiconductor layer being made of a semiconductor of a polycrystal whose crystal grain does not penetrate through its thickness; and performing heat treatment on the stacked body using a flash lamp or a laser.

According to still another aspect of the invention, there is provided a semiconductor memory device including: a word line; a bit line; a resistance change film connected between the word line and the bit line; and a vertical diode connected between the word line and the resistance change film or between the bit line and the resistance change film, the vertical diode including: a first semiconductor layer of a first conductivity type; a second semiconductor layer provided on the first semiconductor layer; and a third semiconductor layer of a second conductivity type provided on the second semiconductor layer, the second semiconductor layer having a lower effective impurity concentration than the first semiconductor layer and the third semiconductor layer, and at least one of the first semiconductor layer, the second semiconductor layer, and the third semiconductor layer being made of a semiconductor of a polycrystal whose crystal grain does not penetrate through its thickness.

DETAILED DESCRIPTION OF THE INVENTION

Embodiments of the invention will now be described with reference to the drawings.

At the outset, a first embodiment of the invention is described.

Figure 1:
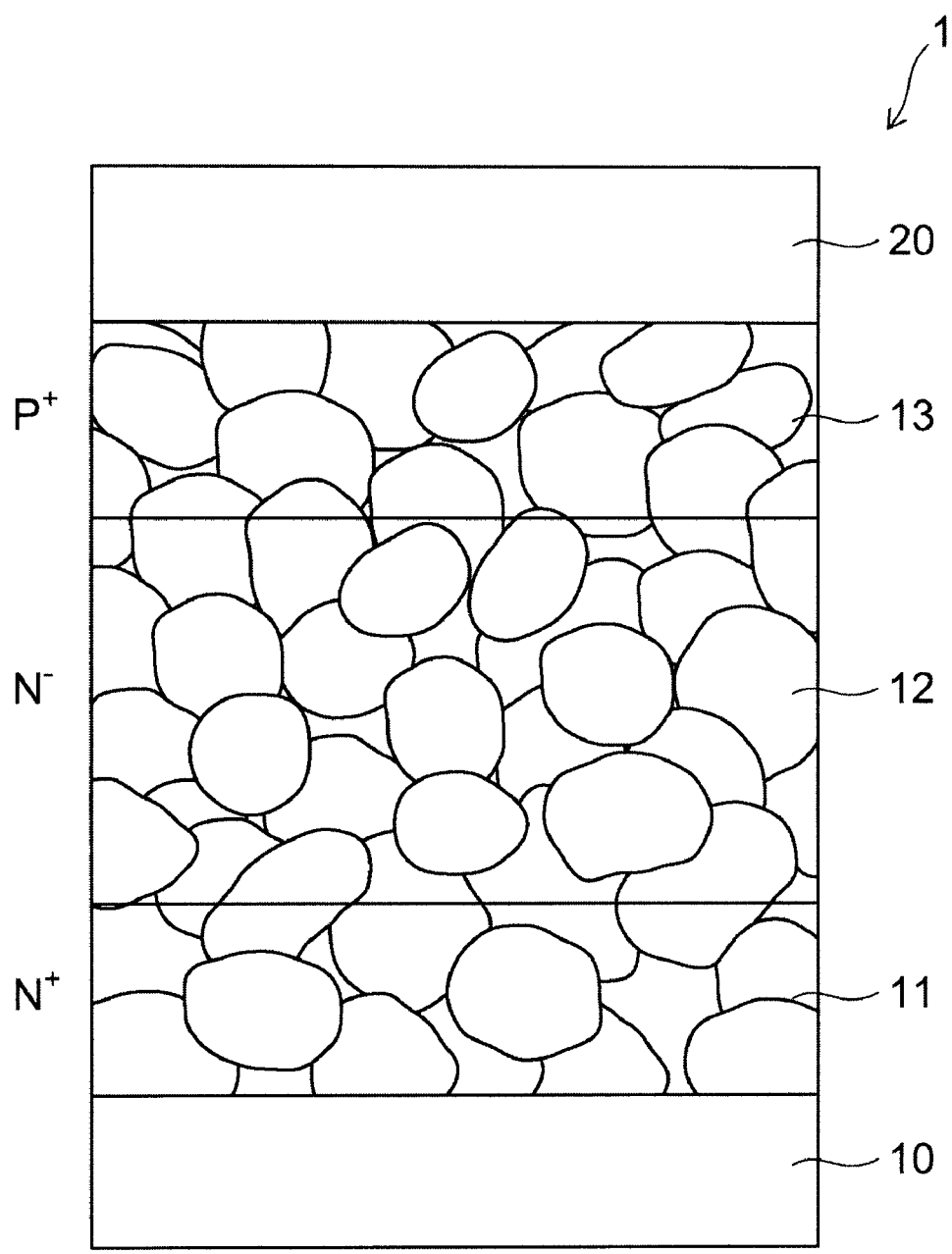
FIG. 1 is a cross-sectional view illustrating a vertical diode according to a first embodiment of the invention.

FIG. 1 is a cross-sectional view illustrating a vertical diode according to this embodiment.

Figure 2:
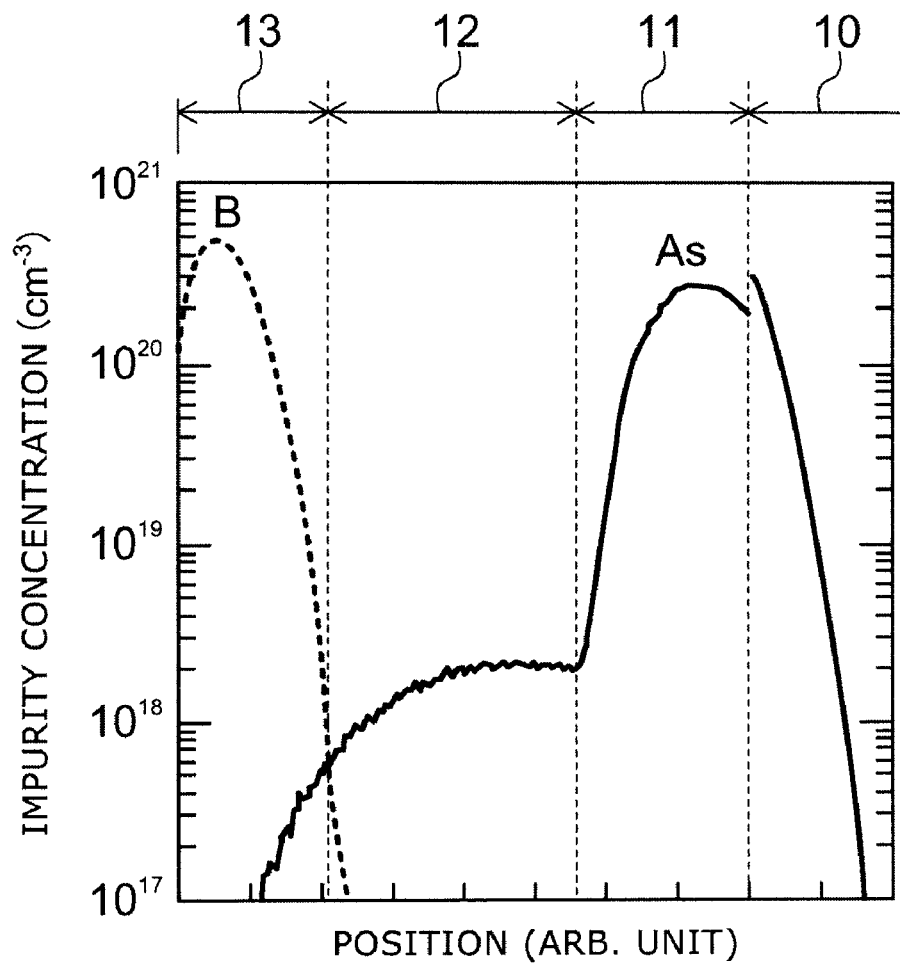
FIG. 2 is a graph illustrating the impurity concentration distribution of the vertical diode according to the first embodiment, where the horizontal axis represents position along the thickness, and the vertical axis represents impurity concentration.

FIG. 2 is a graph illustrating the impurity concentration distribution of the vertical diode according to this embodiment, where the horizontal axis represents position along the thickness, and the vertical axis represents impurity concentration.

In FIG. 1, the crystal structure of each layer is drawn schematically. This also applies to the other cross-sectional views described later.

As shown in FIG. 1, a vertical diode 1 according to this embodiment includes a lower electrode film 10 made of a metal. On the lower electrode film 10, sequentially from bottom, an $N^+$-type layer 11, an $N^-$-type layer 12, and a $P^+$-type layer 13 are stacked. An upper electrode film 20 made of a metal is provided on the $P^+$-type layer 13.

The thickness of the $N^+$-type layer 11 is illustratively 10 to 70 nm (nanometers), particularly 20 to 50 nm, and more particularly 25 nm. The $N^+$-type layer 11 is made of a polycrystalline silicon, and each crystal grain constituting the $N^+$-type layer 11 does not penetrate through the thickness of the $N^+$-type layer 11. In the following, a silicon having a polycrystalline texture in which each crystal grain does not penetrate through the thickness of the layer is referred to as "small grain size polycrystalline silicon". The $N^+$-type layer 11 has a mean crystal grain size of e.g. 20 nm, and the crystal orientation is random orientation. Furthermore, the $N^+$-type layer 11 is doped with arsenic (As) as donor (N-type impurity), and has $N^+$-type conductivity.

Here, randomness in crystal orientation can be estimated illustratively from the intensity ratio of peaks detected by XRD (X-ray Diffraction). For instance, with regard to (111), (220), and (311) orientations primarily detected by XRD, when the orientation of a polycrystalline silicon becomes aligned, the (220) orientation ratio increases. Conversely, when the orientation is randomized, the (220) orientation ratio becomes non-dominant, and the aforementioned three orientations account for equivalent proportions. In this embodiment, the orientation state in which the (220) orientation ratio is 33% or less is defined as "random orientation".

The thickness of the $N^-$-type layer 12 is illustratively 10 to 70 nm, and particularly 20 to 70 nm. The $N^-$-type layer 12 is made of a small grain size polycrystalline silicon in which each crystal grain does not penetrate through the thickness of the $N^-$-type layer 12. Its crystal grain size is illustratively 20 nm, and the orientation is random orientation. Furthermore, the $N^-$-type layer 12 is doped with arsenic (As) as donor (N-type impurity), but its concentration is lower than the donor concentration of the $N^+$-type layer 11. Thus, the $N^-$-type layer 12 has $N^-$-type conductivity.

The thickness of the $P^+$-type layer 13 is illustratively 10 to 70 nm (nanometers), and particularly 20 to 50 nm. For instance, the total thickness of the $N^-$-type layer 12 and the $P^+$-type layer 13 is 75 nm. The $P^+$-type layer 13 is made of a small grain size polycrystalline silicon in which each crystal grain does not penetrate through the thickness of the $P^+$-type layer 13. Its crystal grain size is illustratively 20 nm, and the orientation is random orientation. Furthermore, the $P^+$-type layer 13 is doped with boron (B) as acceptor (P-type impurity), and has $P^+$-type conductivity.

As shown in FIG. 2, the effective impurity concentration of the $N^-$-type layer 12 is lower than that of the $N^+$-type layer 11 and that of the $P^+$-type layer 13. Furthermore, the impurity concentration distribution in each of the $N^+$-type layer 11, the $N^-$-type layer 12, and the $P^+$-type layer 13 is steep, and a PN junction interface is formed between the $N^-$-type layer 12 and the $P^+$-type layer 13. Here, the "effective impurity concentration" of a layer refers to the concentration of impurity contributing to the conductivity of the layer. If the layer contains both of donor impurity and acceptor impurity, the "effective impurity concentration" refers to the concentration of activated impurity from which the amount of cancellation between donor and acceptor has been subtracted.

Next, a method for manufacturing the vertical diode configured as above according to this embodiment is described.

FIGS. 3A to 3C, 4A, 4B, and 5 are process cross-sectional views schematically illustrating the method for manufacturing a vertical diode according to this embodiment.

Figure 3A:
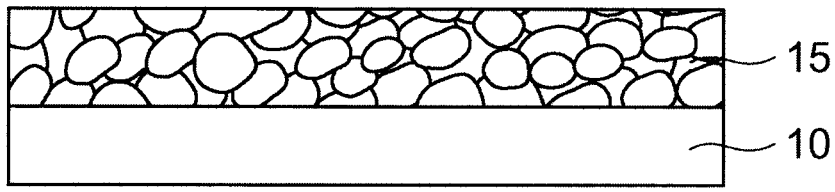
FIGS. 3A to 3C are process cross-sectional views schematically illustrating a method for manufacturing the vertical diode according to the first embodiment.

First, as shown in FIG. 3A, a metal material is deposited on a lower structure (not shown) made of a substrate, an insulating film and the like to form a lower electrode film 10. Next, on the lower electrode film 10, a small grain size polycrystalline layer 15 made of a small grain size polycrystalline silicon in which each crystal grain does not penetrate through the thickness is deposited to a thickness of e.g. 10 to 70 nm, and particularly 25 nm. The small grain size polycrystalline layer 15 will turn to an $N^+$-type layer 11 (see FIG. 1) by introduction and activation of N-type impurity in a later process.

A silicon layer having a small grain size polycrystalline structure can be formed by a CVD (chemical vapor deposition) process under a condition of relatively low temperature and high pressure. For instance, it can be formed by a CVD process at a temperature of 610° C. and a pressure of 0.8 Torr. Here, the silicon crystal not only undergoes solid-phase growth on the substrate, but also grows in the vapor phase, and is deposited on the lower electrode film 10 in a state crystallized to some extent. In contrast, a silicon layer having a normal, columnar crystal structure can be formed by a CVD process under a condition of higher temperature and lower pressure than in forming a small grain size polycrystalline silicon layer. For instance, it can be formed by a CVD process at a temperature of 620° C. and a pressure of 0.2 Torr. In this case, the silicon crystal grows substantially by solid-phase growth alone. Conversely, under the CVD condition of lower temperature and higher pressure than the condition for forming a small grain size polycrystalline silicon layer, a silicon layer having an amorphous structure can be formed.

Figure 3B:
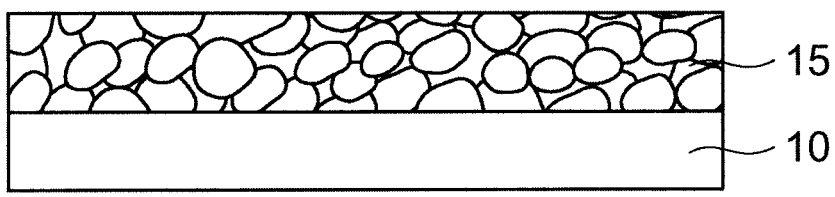

Next, as shown in FIG. 3B, arsenic (As) as N-type impurity is ion-implanted into the small grain size polycrystalline layer 15. This implantation is performed under the condition of, for instance, an acceleration voltage of 20 keV and a dose amount of $5 \times 10^{14}$ cm$^{-2}$.

Figure 3C:
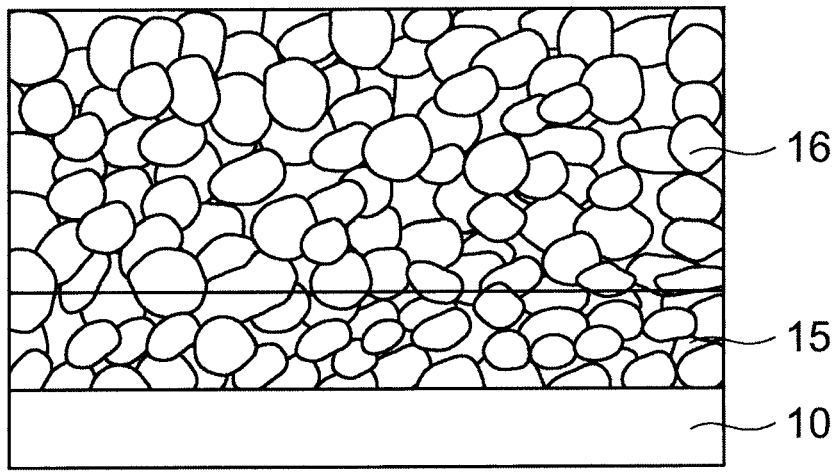

Next, as shown in FIG. 3C, on the small grain size polycrystalline layer 15, a small grain size polycrystalline layer 16 made of a small grain size polycrystalline silicon in which each crystal grain does not penetrate through the thickness is deposited to a thickness of e.g. 75 nm. The small grain size polycrystalline layer 16 will turn to an N⁻-type layer 12 and a P⁺-type layer 13 (see FIG. 1) by introduction and activation of N-type and P-type impurity in a later process.

Figure 4A:
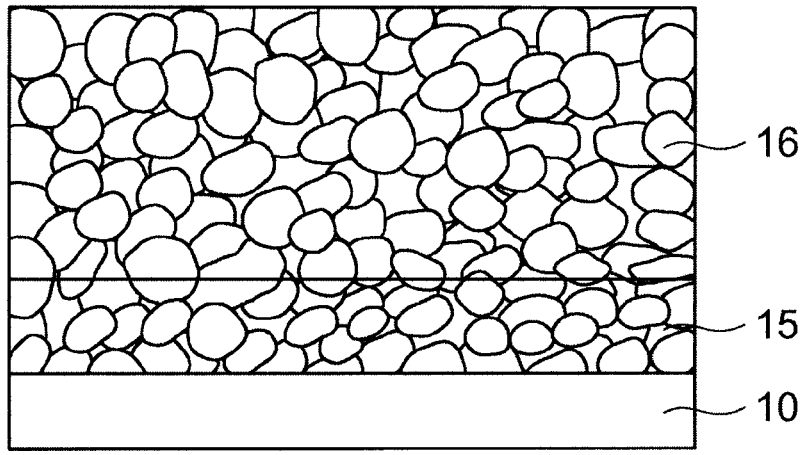
FIGS. 4A and 4B are process cross-sectional views schematically illustrating a method for manufacturing the vertical diode according to the first embodiment.

Next, as shown in FIG. 4A, arsenic (As) as N-type impurity is ion-implanted into the small grain size polycrystalline layer 16. This implantation is performed under a condition such that arsenic is introduced into the lower portion of the small grain size polycrystalline layer 16 and that its concentration is lower than the concentration of arsenic in the small grain size polycrystalline layer 15. For instance, the acceleration voltage is 70 keV, and the dose amount is $1 \times 10^{13}$ cm$^{-2}$.

Figure 4B:
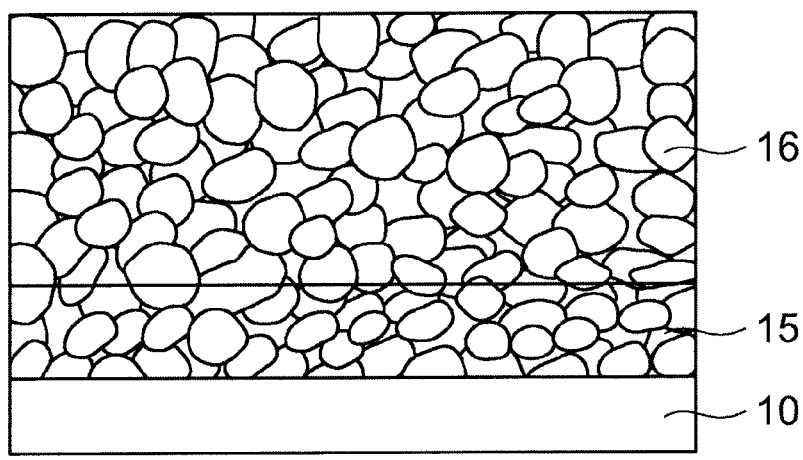

Next, as shown in FIG. 4B, boron (B) as P-type impurity is implanted into the small grain size polycrystalline layer 16. This implantation is performed under a condition such that boron is introduced into the upper portion of the small grain size polycrystalline layer 16 and that its concentration is higher than the concentration of arsenic in the lower portion of the small grain size polycrystalline layer 16. For instance, the acceleration voltage is 1 keV, and the dose amount is $5 \times 10^{14}$ cm$^{-2}$. Consequently, the small grain size polycrystalline layer 16 has a two-layer structure in which the lower portion is doped with arsenic and the upper portion is doped with boron.

Thus, on the lower electrode film 10 is formed a stacked body in which the small grain size polycrystalline layer 15 doped with N-type impurity, the lower portion of the small grain size polycrystalline layer 16 doped with N-type impurity at a lower concentration than the small grain size polycrystalline layer 15, and the upper portion of the small grain size polycrystalline layer 16 doped with boron (B) as P-type impurity are stacked in this order. These layers are each made of a small grain size polycrystalline silicon in which each crystal grain does not penetrate through the thickness of the layer.

Figure 5:
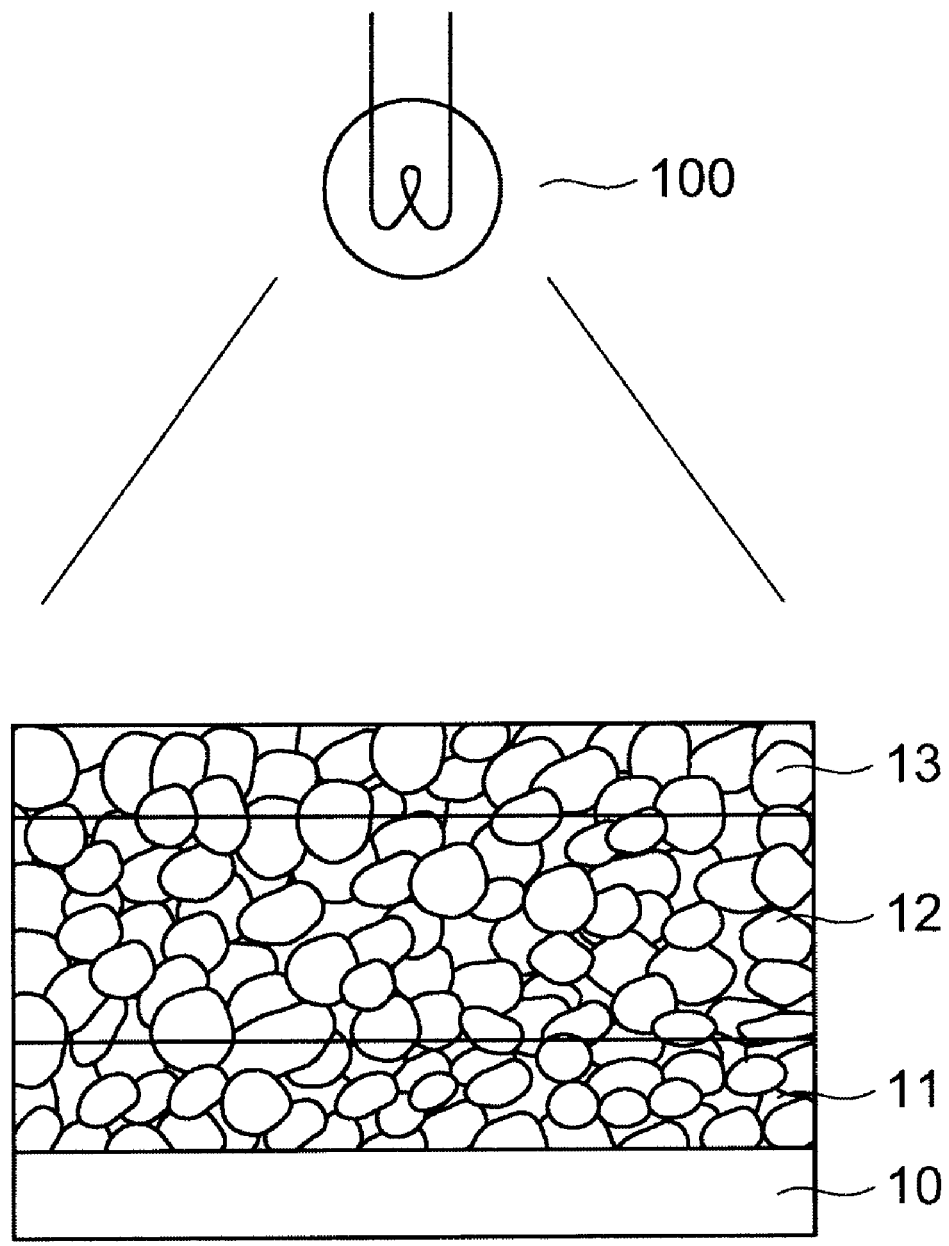
FIG. 5 is a process cross-sectional view schematically illustrating a method for manufacturing the vertical diode according to the first embodiment.

Next, as shown in FIG. 5, millisecond annealing is performed on this stacked body composed of the small grain size polycrystalline layer 15 and the small grain size polycrystalline layer 16. In this specification, millisecond annealing refers to heat treatment using a flash lamp or a laser in which the heating time is illustratively 1 second or less, and particularly 0.1 to 10 msec (milliseconds). In this embodiment, millisecond annealing is performed by irradiating visible light for 0.5 to 10 msec illustratively using a flash lamp 100.

As a result, the temperature of the aforementioned stacked body is presumably increased to approximately 1000 to 1300° C., and the impurity introduced into the small grain size polycrystalline layers 15 and 16 is activated. However, because the heating time is as short as 0.5 to 10 msec, crystal grains scarcely grow, and each layer remains in a small grain size polycrystalline structure. Thus, impurity is activated, and the small grain size polycrystalline layer 15 turns to an N⁺-type layer 11. Furthermore, the lower portion of the small grain size polycrystalline layer 16 turns to an N⁻-type layer 12, and the upper portion thereof turns to a P⁺-type layer 13. Subsequently, an upper electrode film 20 is formed on the P⁺-type layer 13. Thus, the vertical diode 1 shown in FIGS. 1 and 2 is manufactured.

Next, the function and effect of this embodiment are described.

In this embodiment, arsenic is implanted into the small grain size polycrystalline layer 15 in the process shown in FIG. 3B. Here, channeling is suppressed because the small grain size polycrystalline layer 15 is made of a small grain size polycrystalline silicon in which the crystal orientation is random orientation. This can make a steep arsenic concentration distribution in the small grain size polycrystalline layer 15.

Likewise, in the process of implanting arsenic into the small grain size polycrystalline layer 16 shown in FIG. 4A and the process of implanting boron into the small grain size polycrystalline layer 16 shown in FIG. 4B, because the crystal structure of the small grain size polycrystalline layer 16 is a small grain size polycrystalline structure and has random orientation, it is possible to prevent channeling and make a steep impurity concentration distribution.

Furthermore, implantation of impurity into the small grain size polycrystalline layer serves to activate the implanted impurity with a smaller amount of heat than implantation of impurity into an amorphous layer. Hence, impurity can be sufficiently activated even by millisecond annealing with a short heating time. Furthermore, because no crystal grain penetrating through each layer is contained in the small grain size polycrystalline layers 15 and 16, grain boundary diffusion of implanted impurity can be prevented. This serves to prevent long-range diffusion associated with heat treatment, and maintain the steep impurity concentration distribution also after heating.

Thus, according to this embodiment, while the introduced impurity is sufficiently activated, the steep impurity distribution before heating can be maintained also after heating, and a vertical diode having both a high impurity activation ratio and a steep concentration distribution can be realized. This makes it possible to satisfy both a low forward resistance and a high reverse breakdown voltage in the vertical diode.

Next, a comparative example of this embodiment is described.

Figure 6:
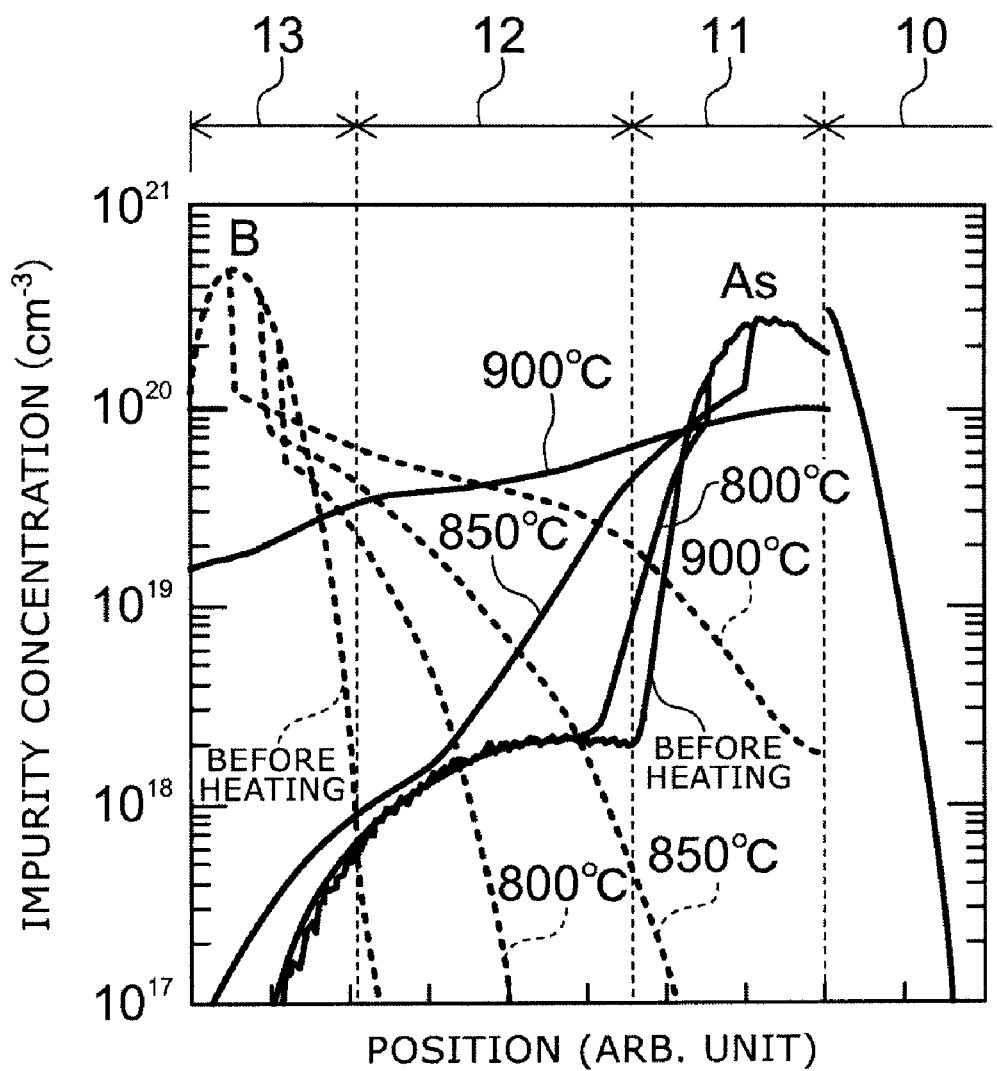
FIG. 6 is a graph illustrating the impurity concentration distribution of a vertical diode according to a comparative example, where the horizontal axis represents position along the thickness, and the vertical axis represents impurity concentration.

FIG. 6 is a graph illustrating the impurity concentration distribution of the vertical diode according to the comparative example, where the horizontal axis represents position along the thickness, and the vertical axis represents impurity concentration.

This comparative example is different from the above first embodiment in that an amorphous layer is formed instead of the small grain size polycrystalline layers 15 and 16 and doped with impurity. Furthermore, instead of millisecond annealing, RTA (Rapid Thermal Annealing) is performed at a temperature of 800 to 900° C. for a time of 5 to 10 seconds using, for instance, a halogen lamp.

In this comparative example, as shown in FIG. 6, channeling is prevented by implanting impurity into the amorphous layer, and a steep impurity concentration distribution can be realized before RTA. However, a large amount of heat is needed to activate the impurity implanted into the amorphous layer. Hence, as an activation heat treatment, it is necessary to perform RTA, which takes a longer heating time than millisecond annealing. Thus, RTA extensively diffuses impurity and broadens the distribution. This results in decreasing the reverse breakdown voltage of the vertical diode.

Furthermore, in this comparative example, if millisecond annealing is performed as an activation heat treatment, activation of impurity is insufficient, which decreases the effective impurity concentration and increase the forward resistance. On the other hand, it may be possible to form a columnar polycrystalline layer and implant impurity therein. However, channeling during implantation and grain boundary diffusion during annealing broaden the impurity distribution and decrease the reverse breakdown voltage.

In contrast, according to the above first embodiment, by combining implantation of impurity into small grain size polycrystalline layers with millisecond annealing, it is possible to make a steep impurity concentration distribution immediately after implantation and maintain the steep impurity concentration distribution also after activation heat treatment.

Next, a second embodiment of the invention is described.

Figure 7:
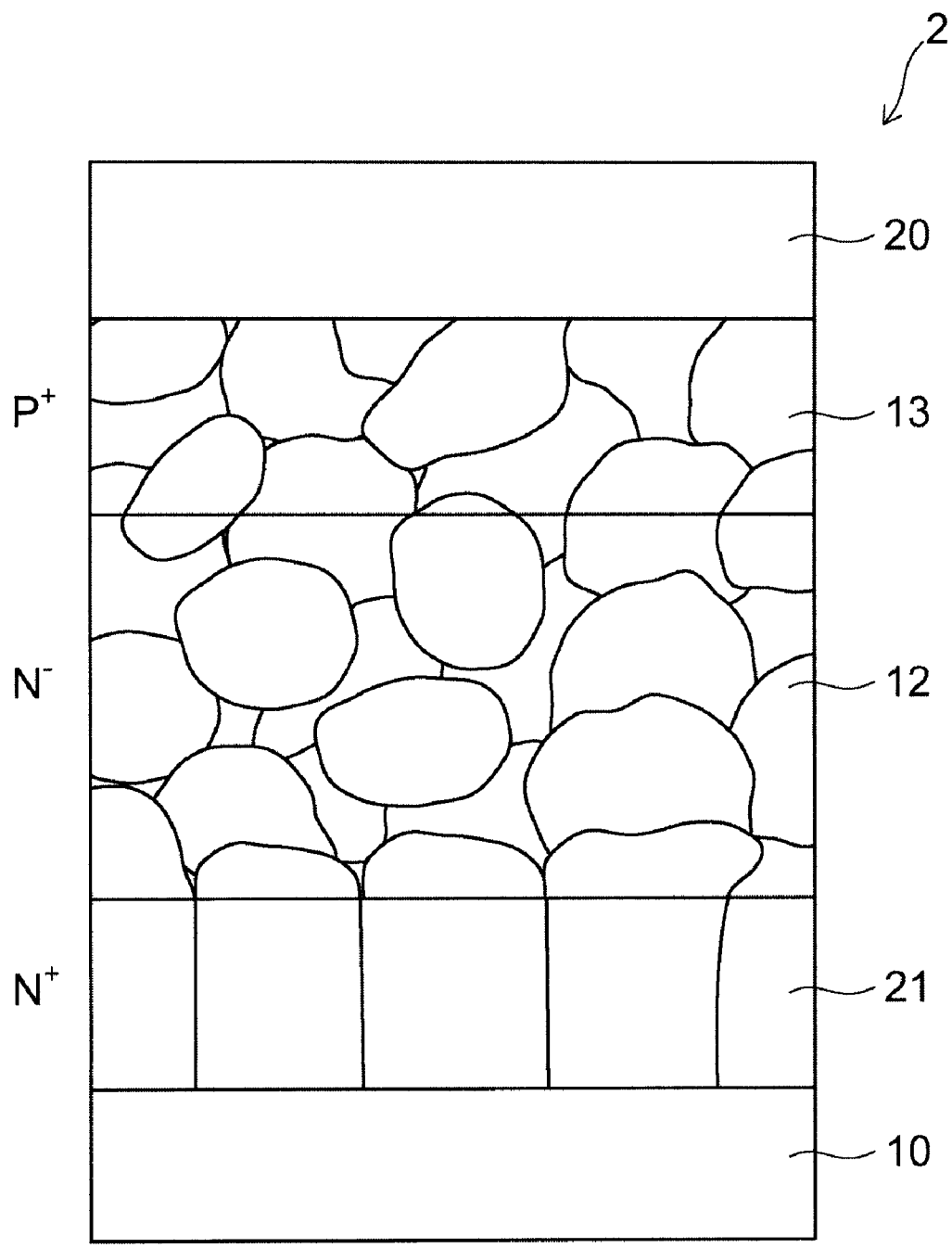
FIG. 7 is a cross-sectional view illustrating a vertical diode according to a second embodiment of the invention.

FIG. 7 is a cross-sectional view illustrating a vertical diode according to this embodiment.

As shown in FIG. 7, a vertical diode 2 according to this embodiment is different from the vertical diode 1 (see FIG. 1) according to the above first embodiment in the crystal structure of the N$^+$-type layer. More specifically, in an N$^+$-type layer 21, which is an N$^+$-type layer of the vertical diode 2, each crystal grain is a columnar crystal penetrating through the thickness of the N$^+$-type layer 21. In the following, a silicon composed of such columnar crystals is referred to as "columnar polycrystalline silicon". As viewed along the thickness, the mean crystal grain size of the N$^+$-type layer 21 is larger than that of the N$^+$-type layer 11 (see FIG. 1), and is illustratively 35 nm. The configuration of this embodiment other than the foregoing is the same as that of the above first embodiment.

Next, a method for manufacturing a vertical diode according to this embodiment is described.

FIGS. 8A to 8C, 9A, 9B, and 10 are process cross-sectional views schematically illustrating the method for manufacturing a vertical diode according to this embodiment.

Figure 8A:
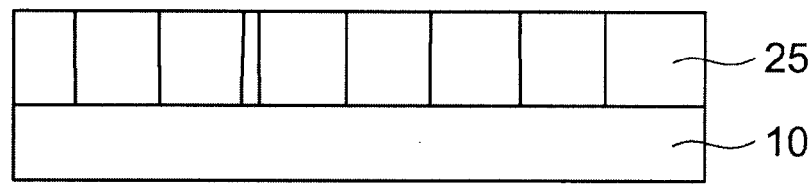
FIGS. 8A to 8C are process cross-sectional views schematically illustrating a method for manufacturing the vertical diode according to the second embodiment.

First, as shown in FIG. 8A, a lower electrode film 10 is formed, and a columnar polycrystalline layer 25 made of a columnar polycrystalline silicon in which each crystal grain penetrates through the thickness is deposited thereon. The columnar polycrystalline layer 25 will turn to an N$^+$-type layer (see FIG. 7) by introduction and activation of N-type impurity in a later process. The thickness of the columnar polycrystalline layer 25 is illustratively 10 to 70 nm, and particularly 25 nm. As described in the above first embodiment, the columnar polycrystalline silicon layer can be formed by a CVD process under a condition of higher temperature and lower pressure than in forming a small grain size polycrystalline silicon layer. For instance, it can be formed by a CVD process at a temperature of 620° C. and a pressure of 0.2 Torr. In this case, the silicon crystal grows substantially by solid-phase growth alone.

Figure 8B:
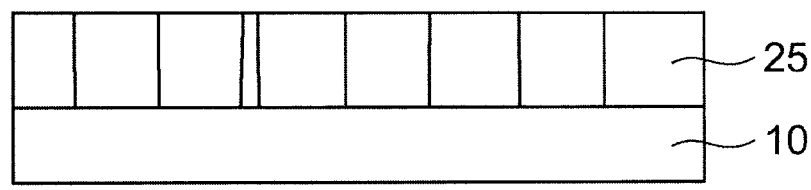

Next, as shown in FIG. 8B, arsenic (As) as N-type impurity is implanted into the columnar polycrystalline layer 25. This implantation is performed under the condition of, for instance, an acceleration voltage of 20 keV and a dose amount of $5 \times 10^{14}$ cm$^{-2}$.

Figure 8C:
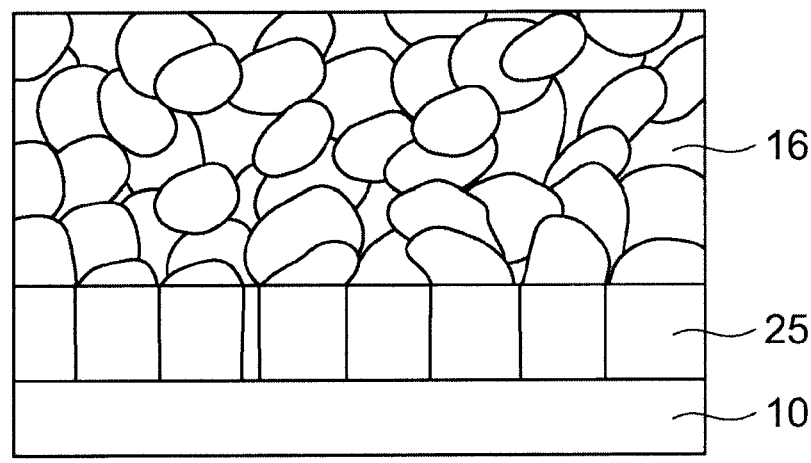

Next, as shown in FIG. 8C, on the columnar polycrystalline layer 25, a small grain size polycrystalline layer 16 made of a small grain size polycrystalline silicon in which each crystal grain does not penetrate through the thickness is deposited to a thickness of e.g. 75 nm.

Figure 9A:
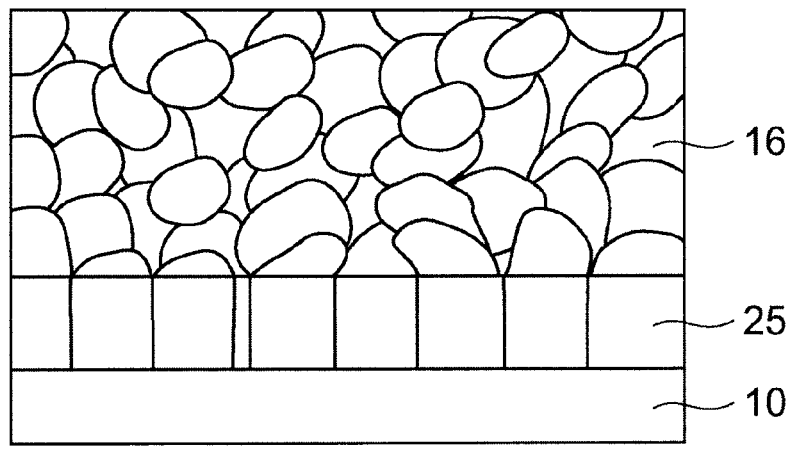
FIGS. 9A and 9B are process cross-sectional views schematically illustrating a method for manufacturing the vertical diode according to the second embodiment.
Figure 9B:
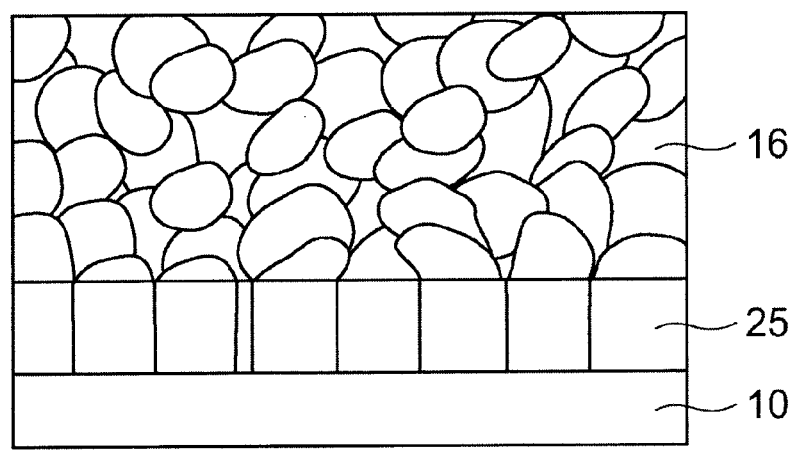

The subsequent manufacturing method is similar to that of the above first embodiment. More specifically, as shown in FIG. 9A, arsenic (As) is implanted into the lower portion of the small grain size polycrystalline layer 16 illustratively at an acceleration voltage of 70 keV and a dose amount of $1 \times 10^{13}$ cm$^{-2}$. Next, as shown in FIG. 9B, boron (B) is implanted into the upper portion of the small grain size polycrystalline layer 16 illustratively at an acceleration voltage of 1 keV and a dose amount of $5 \times 10^{14}$ cm$^{-2}$. Thus, on the columnar polycrystalline layer 25, the lower portion of the small grain size polycrystalline layer 16 made of a small grain size polycrystalline silicon and doped with N-type impurity at a lower concentration than the columnar polycrystalline layer 25, and the upper portion of the small grain size polycrystalline layer 16 made of a small grain size polycrystalline silicon and doped with P-type impurity at a higher concentration than the N-type impurity in the lower portion of the small grain size polycrystalline layer 16 are formed.

Figure 10:
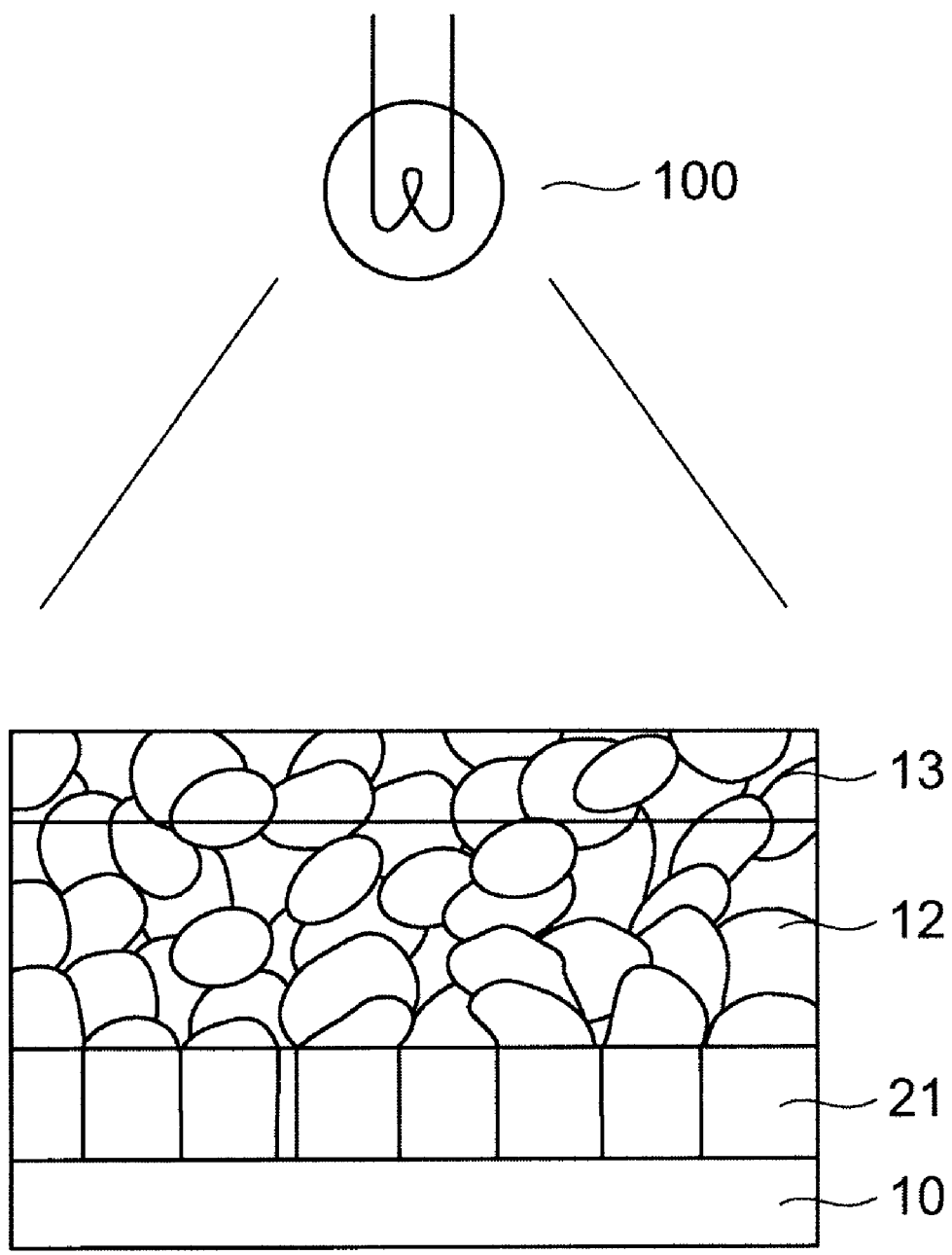
FIG. 10 is a process cross-sectional view schematically illustrating a method for manufacturing the vertical diode according to the second embodiment.

Next, as shown in FIG. 10, millisecond annealing is performed on a stacked body composed of the columnar polycrystalline layer 25 and the small grain size polycrystalline layer 16 (see FIG. 9) illustratively using a flash lamp 100. This activates the impurity implanted into the columnar polycrystalline layer 25 and the small grain size polycrystalline layer 16. Thus, the columnar polycrystalline layer 25 turns to an N$^+$-type layer 21, the lower portion of the small grain size polycrystalline layer 16 turns to an N$^-$-type layer 12, and the upper portion thereof turns to a P$^+$-type layer 13. Subsequently, an upper electrode film 20 is formed. Thus, the vertical diode 2 shown in FIG. 7 is manufactured. The manufacturing method of this embodiment other than the foregoing is the same as that of the above first embodiment.

Next, the function and effect of this embodiment are described.

According to this embodiment, the columnar polycrystalline layer 25 is made of a columnar polycrystalline silicon. Hence, during millisecond annealing, the columnar crystal grain of the columnar polycrystalline layer 25 serves as a nucleus to facilitate grain growth in the N$^-$-type layer 12 and the P$^+$-type layer 13. Consequently, impurity is further activated in each of the N$^+$-type layer 21, the N$^-$-type layer 12, and the P$^+$-type layer 13, and the forward resistance of the vertical diode 2 can be further reduced. The function and effect of this embodiment other than the foregoing are the same as those of the above first embodiment.

In this embodiment, because the columnar polycrystalline layer 25 is made of a columnar polycrystalline silicon, channeling may occur when arsenic is implanted into the columnar polycrystalline layer 25. However, because its underlying layer is the lower electrode film 10 made of a metal, implantation of impurity therein is less problematic. Furthermore, channeling can be suppressed if each layer has random orientation at the time of impurity implantation. Hence, there is no problem if, after annealing, grain growth proceeds in the N$^-$-type layer 12 and the P$^+$-type layer 13 and the resulting crystal structure does not have random orientation.

Next, a third embodiment of the invention is described.

Figure 11:
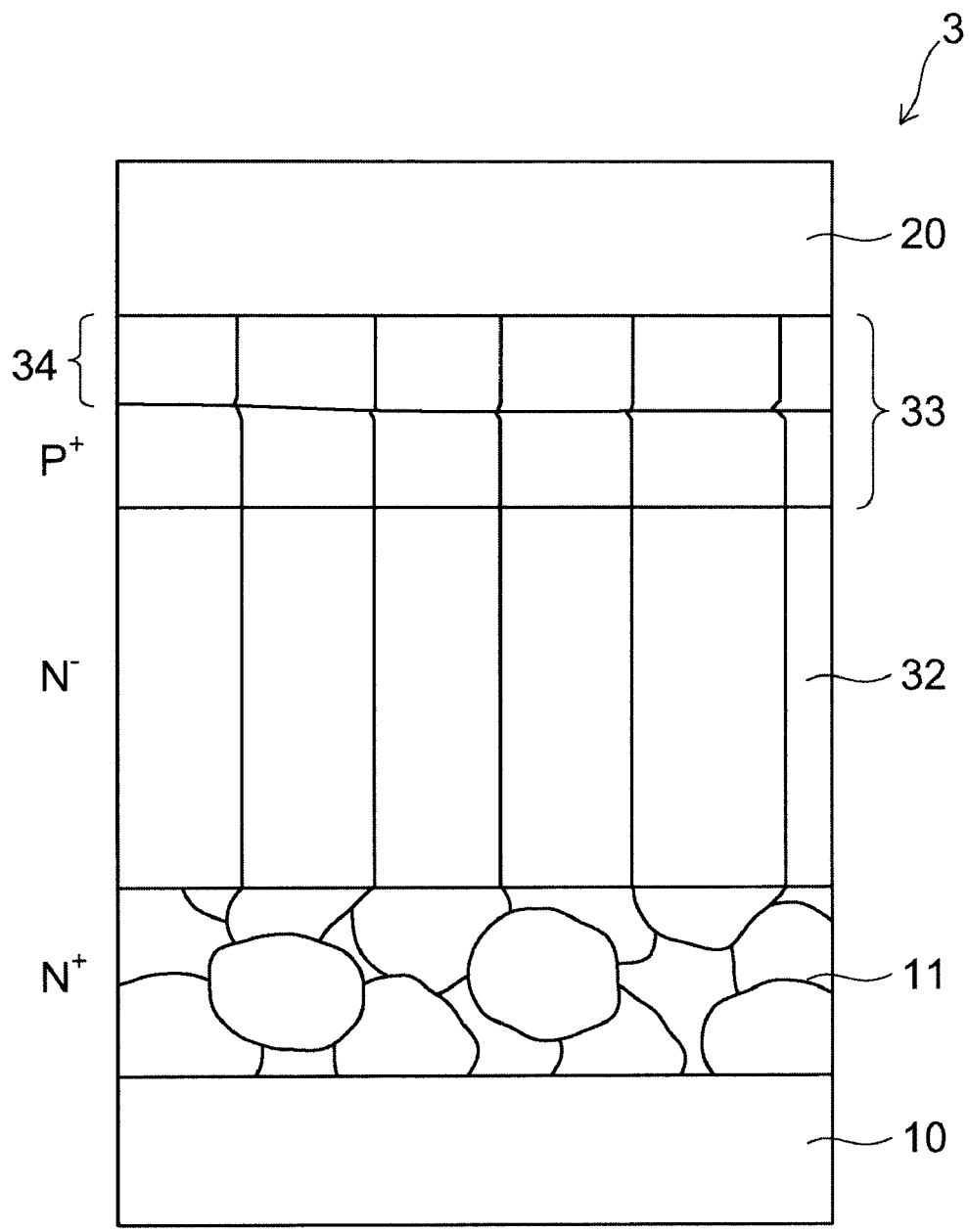
FIG. 11 is a cross-sectional view illustrating a vertical diode according to a third embodiment of the invention.

FIG. 11 is a cross-sectional view illustrating a vertical diode according to this embodiment.

As shown in FIG. 11, a vertical diode 3 according to this embodiment is different from the vertical diode 1 (see FIG. 1) according to the above first embodiment in the crystal structure of the N$^-$-type layer and the P$^+$-type layer. Instead of the N$^-$-type layer 12 and the P$^+$-type layer 13 (see FIG. 1) made of a small grain size polycrystalline silicon, the vertical diode 3 includes an N$^-$-type layer 32 and a P$^+$-type layer 33 made of a columnar polycrystalline silicon. That is, each crystal grain constituting the N$^-$-type layer 32 and the P$^+$-type layer 33 is a columnar crystal penetrating through the thickness of the N$^-$-type layer 32 and the P$^+$-type layer 33. As viewed along the thickness, the crystal grain size of the N$^-$-type layer 32 and the P$^+$-type layer 33 is larger than that of the N$^-$-type layer 12 and the P$^+$-type layer 13 (see FIG. 1), and is illustratively 35 nm. Furthermore, the superficial layer of the P$^+$-type layer 33 contains germanium (Ge) and constitutes a Si—Ge compound layer 34. The configuration of this embodiment other than the foregoing is the same as that of the above first embodiment.

Next, a method for manufacturing a vertical diode according to this embodiment is described.

FIGS. 12A to 12C, 13A to 13C, and 14 are process cross-sectional views schematically illustrating the method for manufacturing a vertical diode according to this embodiment.

Figure 12A:
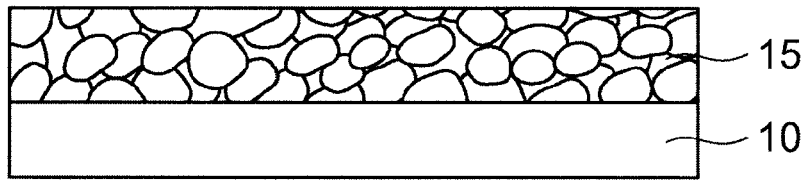
FIGS. 12A to 12C are process cross-sectional views schematically illustrating a method for manufacturing the vertical diode according to the third embodiment.

First, as shown in FIG. 12A, a lower electrode film 10 is formed, and a small grain size polycrystalline layer 15 made of a small grain size polycrystalline silicon in which each crystal grain does not penetrate through the thickness is deposited thereon to a thickness of e.g. 10 to 70 nm, and particularly 25 nm.

Figure 12B:
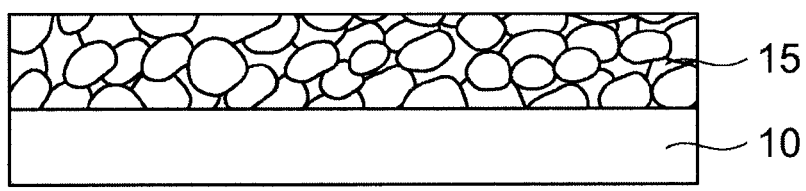

Next, as shown in FIG. 12B, arsenic (As) is implanted into the small grain size polycrystalline layer 15. This implantation is performed under the condition of, for instance, an acceleration voltage of 20 keV and a dose amount of $5 \times 10^{14}$ cm$^{-2}$ as in the above first embodiment.

Figure 12C:
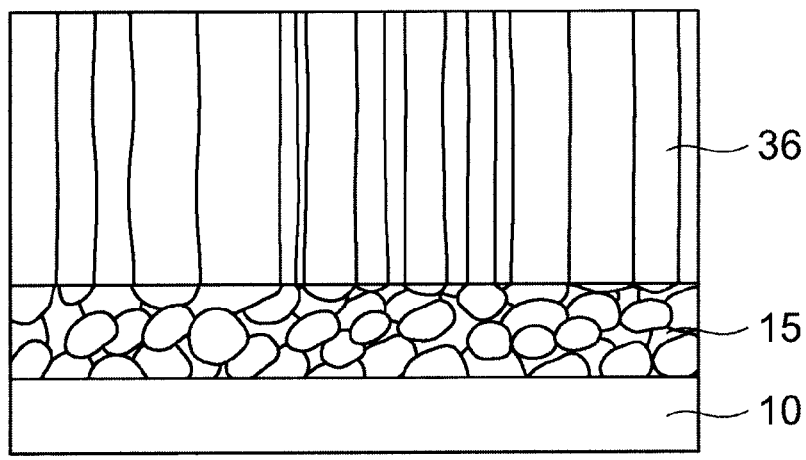

Next, as shown in FIG. 12C, on the small grain size polycrystalline layer 15, a columnar polycrystalline layer 36 made of a columnar polycrystalline silicon in which each crystal grain penetrates through the thickness is deposited to a thickness of e.g. 75 nm. The columnar polycrystalline layer 36 will turn to an N$^-$-type layer 32 and a P$^+$-type layer 33 by introduction and activation of N-type and P-type impurity in a later process.

Figure 13A:
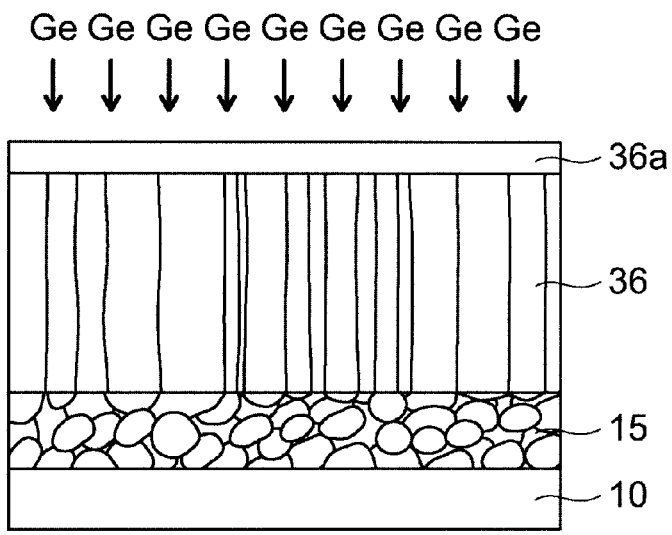
FIGS. 13A to 13C are process cross-sectional views schematically illustrating a method for manufacturing the vertical diode according to the third embodiment.

Next, as shown in FIG. 13A, germanium (Ge) is implanted into the superficial layer of the columnar polycrystalline layer 36 from above. Thus, the superficial layer of the columnar polycrystalline layer 36 is amorphized into an amorphous layer 36a.

Figure 13B:
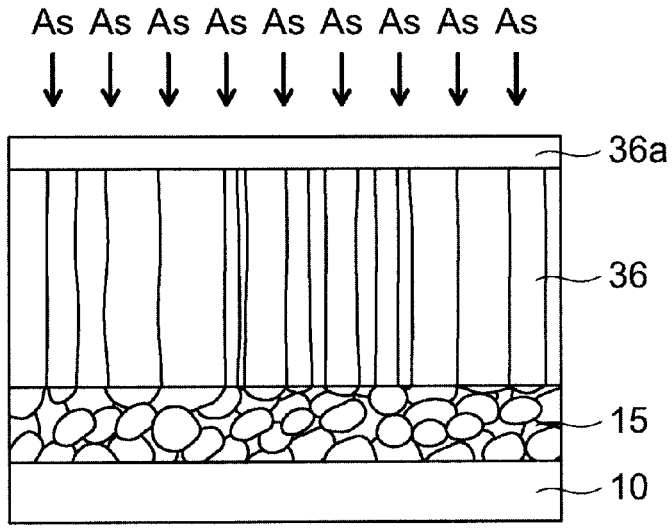
Figure 13C:
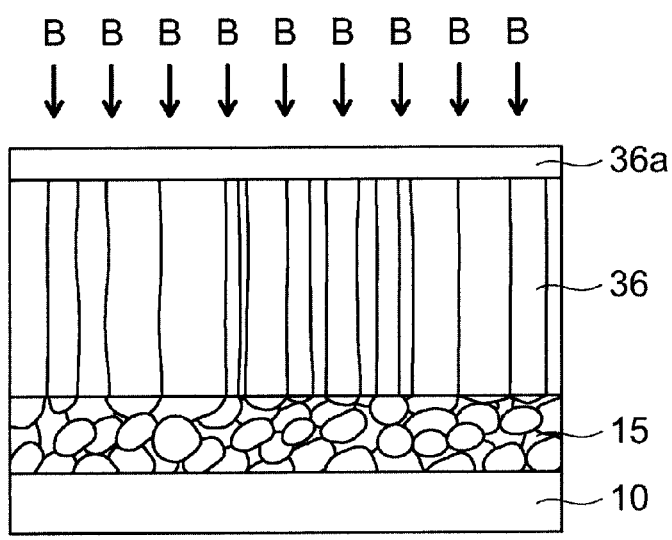

Next, as shown in FIG. 13B, arsenic (As) is implanted into the lower portion of the columnar polycrystalline layer 36 illustratively at an acceleration voltage of 70 keV and a dose amount of $1 \times 10^{13}$ cm$^{-2}$. Next, as shown in FIG. 13C, boron (B) is implanted into the upper portion of the columnar polycrystalline layer 36 illustratively at an acceleration voltage of 1 keV and a dose amount of $5 \times 10^{14}$ cm$^{-2}$. Here, boron is introduced into the amorphous layer 36a and therebelow.

Figure 14:
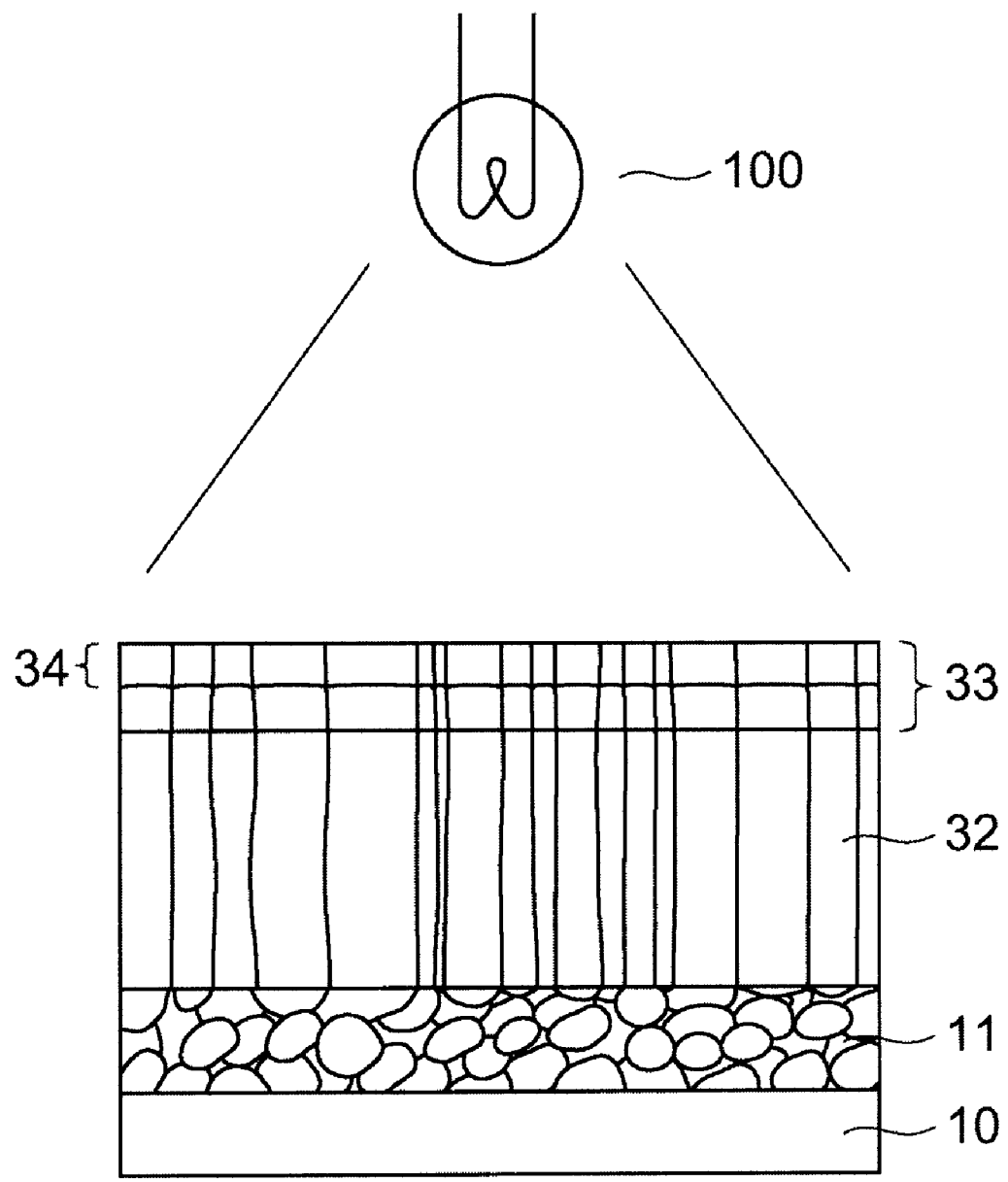
FIG. 14 is a process cross-sectional view schematically illustrating a method for manufacturing the vertical diode according to the third embodiment.

Next, as shown in FIG. 14, millisecond annealing is performed on a stacked body composed of the small grain size polycrystalline layer 15 and the columnar polycrystalline layer 36 (see FIG. 13) illustratively using a flash lamp 100. This crystallizes and silicidizes the amorphous layer 36a into a Si—Ge compound layer 34, and activates the impurity implanted into the small grain size polycrystalline layer 15 and the columnar polycrystalline layer 36. Thus, the small grain size polycrystalline layer 15 turns to an N$^+$-type layer 11, the lower portion of the columnar polycrystalline layer 36 turns to an N$^-$-type layer 32, and the upper portion thereof turns to a P$^+$-type layer 33. Subsequently, an upper electrode film 20 is formed. Thus, the vertical diode 3 shown in FIG. 11 is manufactured. The manufacturing method of this embodiment other than the foregoing is the same as that of the above first embodiment.

Next, the function and effect of this embodiment are described.

In this embodiment, a columnar polycrystalline layer 36 made of a columnar polycrystalline silicon is formed in the process shown in FIG. 12C, and germanium (Ge) is implanted into the superficial layer of the columnar polycrystalline layer 36 to form an amorphous layer 36a in the process shown in FIG. 13A. By the amorphous layer 36a thus provided, channeling can be suppressed when arsenic (As) and boron (B) are implanted in the processes shown in FIGS. 13B and 13C, respectively, and grain boundary diffusion of impurity can be suppressed when millisecond annealing is performed in the process shown in FIG. 14. Thus, a steep impurity concentration distribution can be obtained. Furthermore, the columnar polycrystalline silicon remains in the lower portion of the columnar polycrystalline layer 36, that is, a portion other than the amorphous layer 36a. Hence, it serves as a nucleus to facilitate crystallization of the amorphous layer 36a and the small grain size polycrystalline layer 15, and impurity can be sufficiently activated.

Furthermore, this embodiment achieves low resistance because a Si—Ge compound layer 34 is formed in the superficial layer of the P$^+$-type layer 33. In particular, the contact resistance between the P$^+$-type layer 33 and the upper electrode film 20 is low. Hence, a large amount of forward current can flow through the vertical diode 3. The function and effect of this embodiment other than the foregoing are the same as those of the above first embodiment.

Next, a fourth embodiment of the invention is described.

Figure 15:
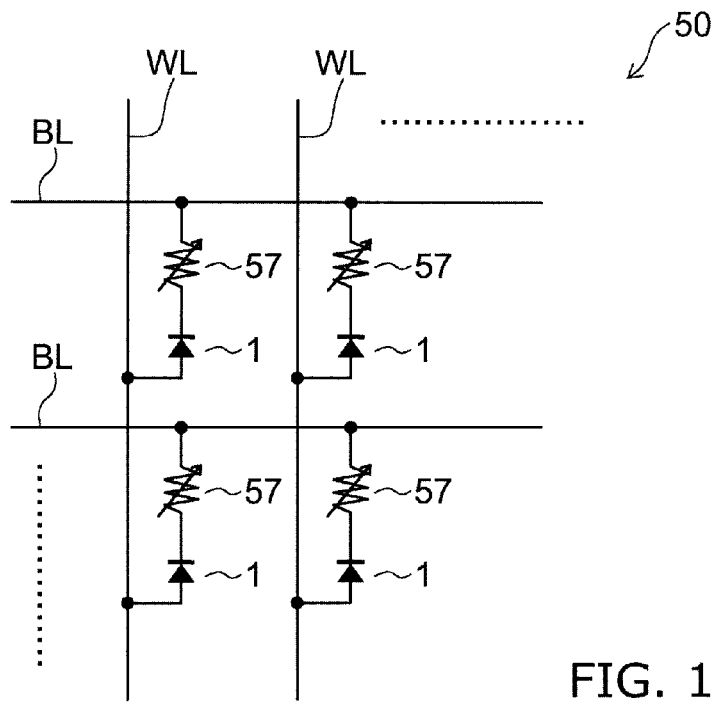
FIG. 15 is a circuit diagram illustrating a semiconductor memory device according to a fourth embodiment.

FIG. 15 is a circuit diagram illustrating a semiconductor memory device according to this embodiment.

Figure 16:
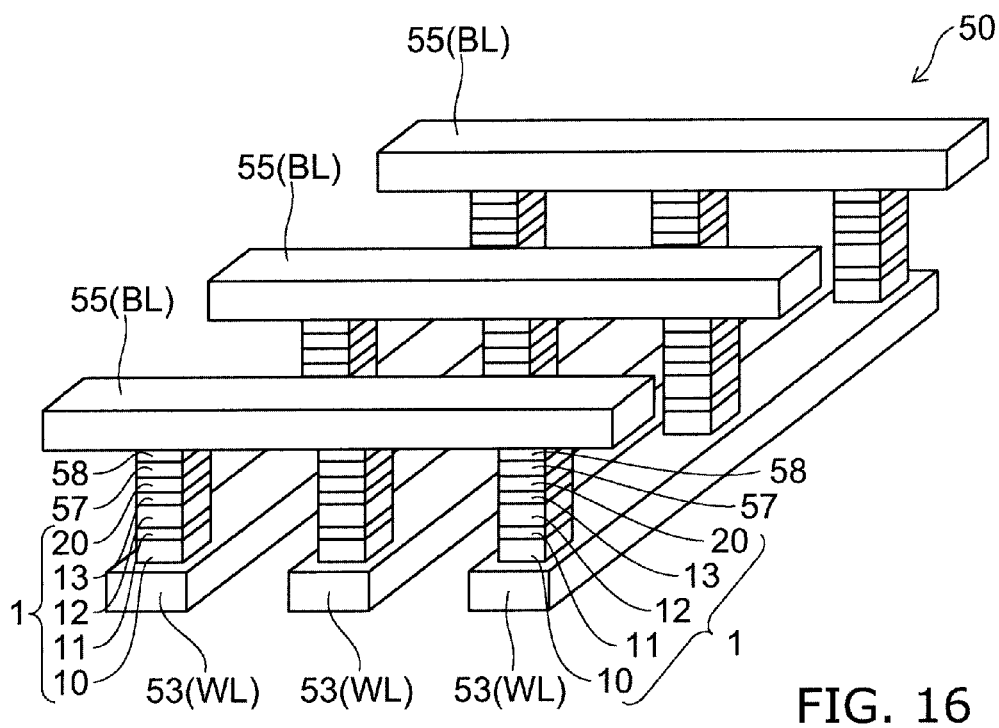
FIG. 16 is a perspective view illustrating the semiconductor memory device according to the fourth embodiment.

FIG. 16 is a perspective view illustrating the semiconductor memory device according to this embodiment.

Figure 17:
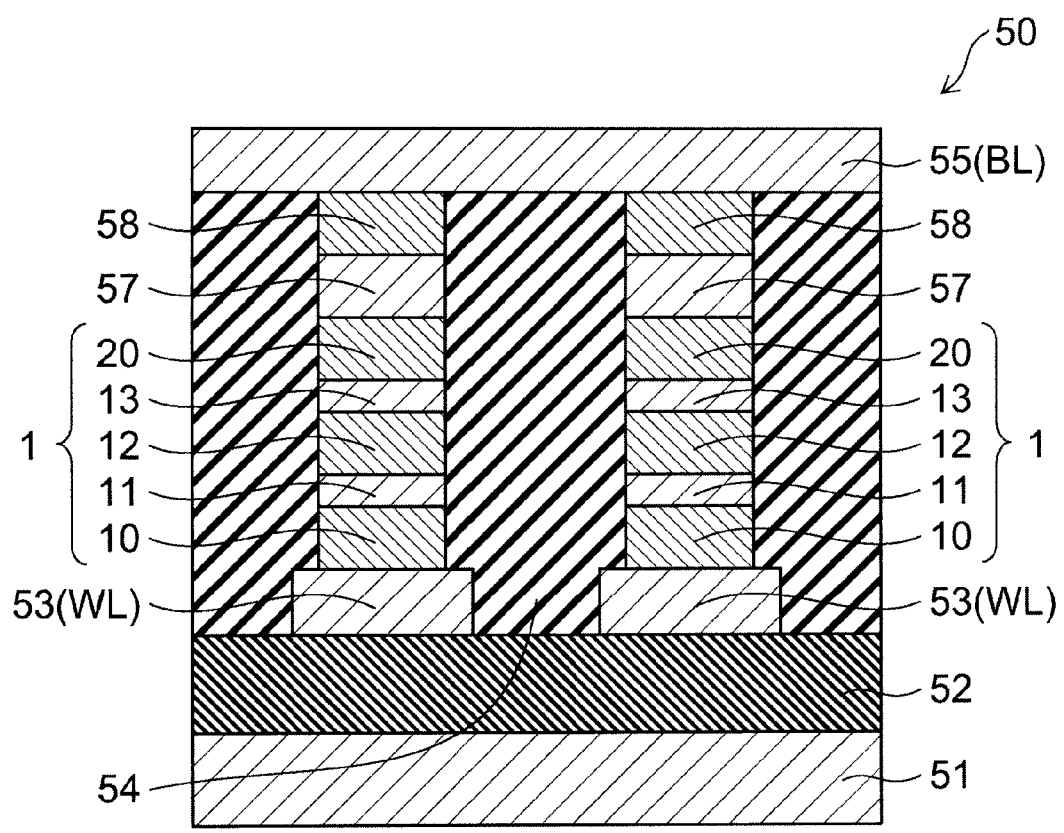
FIG. 17 is a cross-sectional view illustrating the semiconductor memory device according to the fourth embodiment.

FIG. 17 is a cross-sectional view illustrating the semiconductor memory device according to this embodiment.

In FIG. 16, the semiconductor substrate and the insulating film are not shown for clarity of illustration.

The semiconductor memory device according to this embodiment is a ReRAM (Resistance Random Access Memory).

As shown in FIGS. 15 to 17, the ReRAM 50 according to this embodiment includes a semiconductor substrate 51. An insulating film 52 is formed on the semiconductor substrate 51, and a plurality of interconnect layers 53 are provided on the insulating film 52. The plurality of interconnect layers 53 are spaced from each other and extend in one direction parallel to the upper surface of the semiconductor substrate 51. Each of the interconnect layers 53 functions as a word line WL of the ReRAM 50. For instance, the semiconductor substrate 51 is a silicon chip, the insulating film 52 is a silicon oxide film, and the interconnect layers 53 are metal interconnects.

An interlayer insulating film 54 is formed on the insulating film 52 so as to bury the interconnect layers 53. Furthermore, a plurality of interconnect layers 55 are provided on the interlayer insulating film 54. The plurality of interconnect layers 55 are spaced from each other and extend in a direction parallel to the upper surface of the semiconductor substrate 51 and orthogonal to the extending direction of the interconnect layers 53. Each of the interconnect layers 55 functions as a bit line BL of the ReRAM 50. The interconnect layers 55 are not in contact with the interconnect layers 53, and these interconnect layers are skew to each other.

Furthermore, a vertical diode 1 and a resistance change film 57 are provided in the nearest portion between each of the interconnect layers 53 and each of the interconnect layers 55 inside the interlayer insulating film 54. The vertical diode 1 has the same configuration as the vertical diode 1 according to the above first embodiment. More specifically, immediately above each of the interconnect layers 53 and immediately below each of the interconnect layers 55, a lower electrode film 10, an N$^+$-type layer 11, an N$^-$-type layer 12, a P$^+$-type layer 13, and an upper electrode film 20 are provided sequentially from bottom. The lower surface of the lower electrode film 10 is in contact with the upper surface of the interconnect layer 53, and hence the lower electrode film 10 is connected to the interconnect layer 53.

The resistance change film 57 is provided on and in contact with the upper electrode film 20. The resistance change film 57 is a film whose electrical resistance reversibly changes with the applied voltage, and illustratively a phase change film formed from a chalcogenide compound, that is, a compound containing a group VIB element such as Se and Te, whose fine structure undergoes phase change between the crystalline state and the amorphous state by application of voltage. Alternatively, the resistance change film 57 may be formed from Ti-doped $NiO_x$, $NbO_x$, Cr-doped $SrTiO_{3-x}$, $Pr_xCa_yMnO_z$, $ZrO_x$, $NiO_x$, $ZnO_x$, $TiO_x$, $TiO_xN_y$, $CuO_x$, $GdO_x$, $CuTe_x$, $HfO_x$, $ZnMn_xO_y$, or $ZnFe_xO_y$.

An electrode film 58 is provided on the resistance change film 57. The lower surface of the electrode film 58 is in contact with the upper surface of the resistance change film 57, and the upper surface of the electrode film 58 is in contact with the lower surface of each of the interconnect layers 55. Thus, between each of the interconnect layers 53 and each of the interconnect layers 55 from the interconnect layers 53 toward the interconnect layers 55, the lower electrode film 10, the $N^+$-type layer 11, the $N^-$-type layer 12, the $P^+$-type layer 13, the upper electrode film 20, the resistance change film 57, and the electrode film 58 are stacked in this order. Consequently, the resistance change film 57 is connected between each of the interconnect layers 53 serving as a word line and each of the interconnect layers 55 serving as a bit line, and the vertical diode 1 is connected between each of the interconnect layers 53 serving as a word line and the resistance change film 57. Thus, one resistance change film 57 and one vertical diode 1 connected to each other constitute one memory cell.

Furthermore, in the ReRAM 50, the basic structure composed of a plurality of interconnect layers 53, a plurality of interconnect layers 55, a plurality of vertical diodes 1, and a plurality of resistance change films 57 described above is provided in a plurality of stages along the direction perpendicular to the upper surface of the semiconductor substrate 51 to constitute a stacked structure. Thus, a plurality of memory cells are arranged in a three-dimensional matrix.

In this embodiment, the vertical diode 1 according to the above first embodiment is used in the ReRAM 50. Thus, it is possible to reduce the thickness of the vertical diode 1 while satisfying both a low forward resistance and a high reverse breakdown voltage. This improves workability in manufacturing the ReRAM 50, and it is possible to increase the number of layers in the ReRAM 50 and enhance the integration density of memory cells.

The invention has been described with reference to the embodiments. However, the invention is not limited to these embodiments. For instance, the above embodiments can be practiced in combination with each other. For instance, in the above fourth embodiment, the vertical diode constituting the memory cell can be the vertical diode 2 (see FIG. 7) according to the second embodiment or the vertical diode 3 (see FIG. 11) according to the third embodiment.

Furthermore, those skilled in the art can suitably modify the above embodiments by addition, deletion, or design change of components, or by addition, omission, or condition change of processes, and such modifications are also encompassed within the scope of the invention as long as they fall within the spirit of the invention. For instance, while an $N^-$-type layer is illustratively provided between the $N^+$-type layer and the $P^+$-type layer in the above embodiments, the invention is not limited thereto. The layer provided between the $N^+$-type layer and the $P^+$-type layer can be any layer whose effective impurity concentration is lower than that of the $N^+$-type layer and the $P^+$-type layer, and may be a $P^-$-type layer or an I-type layer.

Furthermore, in the embodiments illustrated above, a silicon layer to serve as an $N^+$-type layer is formed and then doped with N-type impurity (donor), and subsequently, a silicon layer to serve as an $N^-$-type layer and a $P^+$-type layer is formed at a time and doped with N-type impurity (donor) and P-type impurity (acceptor). However, the invention is not limited thereto. For instance, after a silicon layer is formed, a unit process for implanting impurity may be repeated three times. Alternatively, after a silicon layer to serve as an $N^+$-type layer and an $N^-$-type layer is first formed at a time, implantation of N-type impurity may be performed twice, and subsequently, a silicon layer to serve as a $P^+$-type layer may be formed and doped with P-type impurity. Alternatively, after a thick silicon layer for three layers is formed, N-type impurity may be implanted twice, and P-type impurity may be implanted once.

In the first embodiment illustrated above, the $N^+$-type layer 11, the $N^-$-type layer 12, and the $P^+$-type layer 13 are all made of a small grain size polycrystalline silicon. In the second embodiment illustrated above, the $N^+$-type layer 21 is made of a columnar polycrystalline silicon, and the $N^-$-type layer 12 and the $P^+$-type layer 13 are made of a small grain size polycrystalline silicon. In the third embodiment illustrated above, the $N^+$-type layer 11 is made of a small grain size polycrystalline silicon, and the $N^-$-type layer 32 and the $P^+$-type layer 33 are made of a columnar polycrystalline silicon. However, the invention is not limited thereto as long as at least one of the $N^+$-type layer, the $N^-$-type layer, and the $P^+$-type layer is formed from a small grain size polycrystalline semiconductor.

Moreover, in the above embodiments, flash lamp annealing is illustratively used for millisecond annealing. However, the invention is not limited thereto. For instance, laser annealing with an irradiation time of approximately 0.1 msec may be used.

Moreover, in the above fourth embodiment, each memory cell illustratively includes a vertical diode on the word line side and a resistance change film on the bit line side. However, this arrangement may be reversed.

The invention claimed is:

1. A vertical diode comprising:
a first semiconductor layer of a first conductivity type;
a second semiconductor layer provided on the first semiconductor layer; and
a third semiconductor layer of a second conductivity type provided on the second semiconductor layer,
the second semiconductor layer having a lower effective impurity concentration than the first semiconductor layer and the third semiconductor layer, and
at least one of the first semiconductor layer, the second semiconductor layer, and the third semiconductor layer being made of a semiconductor of a polycrystal whose crystal grain does not penetrate through its thickness.

2. A method for manufacturing a vertical diode, comprising:
forming a stacked body on an electrode film, the stacked body including a first semiconductor layer and doped with first conductivity type impurity, a second semiconductor layer, and a third semiconductor layer doped with second conductivity type impurity stacked in this order, the second semiconductor layer having a lower effective impurity concentration than the first semiconductor layer and the third semiconductor layer, and at least one of the first semiconductor layer, the second semiconductor layer, and the third semiconductor layer being made of a semiconductor of a polycrystal whose crystal grain does not penetrate through its thickness; and
performing heat treatment on the stacked body using a flash lamp or a laser.

3. The method according to claim 2, wherein the forming the stacked body includes:
- forming a first small grain size polycrystalline layer made of a semiconductor of a polycrystal whose crystal grain does not penetrate through its thickness;
- doping the first small grain size polycrystalline layer with the first conductivity type impurity;
- forming, on the first small grain size polycrystalline layer, a second small grain size polycrystalline layer made of a semiconductor of a polycrystal whose crystal grain does not penetrate through its thickness;
- doping a lower portion of the second small grain size polycrystalline layer with the first conductivity type impurity; and
- doping an upper portion of the second small grain size polycrystalline layer with the second conductivity type impurity.

4. The method according to claim 2, wherein the forming the stacked body includes:
- forming a columnar polycrystalline layer made of a semiconductor of a columnar polycrystal whose crystal grain penetrates through its thickness;
- doping the columnar polycrystalline layer with the first conductivity type impurity;
- forming, on the columnar polycrystalline layer, a small grain size polycrystalline layer made of a semiconductor of a polycrystal whose crystal grain does not penetrate through its thickness;
- doping a lower portion of the small grain size polycrystalline layer with the first conductivity type impurity; and
- doping an upper portion of the small grain size polycrystalline layer with the second conductivity type impurity.

5. The method according to claim 4, wherein
the columnar polycrystalline layer and the small grain size polycrystalline layer are formed by chemical vapor deposition,
temperature for forming the small grain size polycrystalline layer is lower than temperature for forming the columnar polycrystalline layer, and
pressure for forming the small grain size polycrystalline layer is higher than pressure for forming the columnar polycrystalline layer.

6. The method according to claim 2, wherein the forming the stacked body includes:
- forming a small grain size polycrystalline layer made of a semiconductor of a polycrystal whose crystal grain does not penetrate through its thickness;
- doping the small grain size polycrystalline layer with the first conductivity type impurity;
- forming, on the small grain size polycrystalline layer, a columnar polycrystalline layer made of a semiconductor of a columnar polycrystal whose crystal grain penetrates through its thickness;
- amorphousing an upper portion of the columnar polycrystalline layer by implanting an impurity into the columnar polycrystalline layer from above;
- doping a lower portion of the columnar polycrystalline layer with the first conductivity type impurity; and
- doping an upper portion of the columnar polycrystalline layer with the second conductivity type impurity.

7. The method according to claim 6, wherein
the columnar polycrystalline layer and the small grain size polycrystalline layer are formed by chemical vapor deposition,
temperature for forming the small grain size polycrystalline layer is lower than temperature for forming the columnar polycrystalline layer, and
pressure for forming the small grain size polycrystalline layer is higher than pressure for forming the columnar polycrystalline layer.

8. The method according to claim 6, wherein
the small grain size polycrystalline layer and the columnar polycrystalline layer are formed by deposition of silicon, and
germanium is implanted as the impurity.

9. The method according to claim 2, wherein heating time for the heat treatment is 1 second or less.

10. The method according to claim 9, wherein the heating time for the heat treatment is 0.1 to 10 milliseconds.

11. A semiconductor memory device comprising:
- a word line;
- a bit line;
- a resistance change film connected between the word line and the bit line; and
- a vertical diode connected between the word line and the resistance change film or between the bit line and the resistance change film,
the vertical diode including:
- a first semiconductor layer of a first conductivity type;
- a second semiconductor layer provided on the first semiconductor layer; and
- a third semiconductor layer of a second conductivity type provided on the second semiconductor layer,
the second semiconductor layer having a lower effective impurity concentration than the first semiconductor layer and the third semiconductor layer, and
at least one of the first semiconductor layer, the second semiconductor layer, and the third semiconductor layer being made of a semiconductor of a polycrystal whose crystal grain does not penetrate through its thickness.

12. The device according to claim 11, wherein a conductivity type of the second semiconductor layer is the first conductivity type.

13. The device according to claim 11, wherein the second semiconductor layer is formed from an intrinsic semiconductor.

14. The device according to claim 11, wherein a conductivity type of the second semiconductor layer is the second conductivity type.

15. The device according to claim 11, wherein the polycrystal whose crystal grain does not penetrate through its thickness has random orientation.

16. The device according to claim 15, wherein
the polycrystal whose crystal grain does not penetrate through its thickness is made of silicon, and
the polycrystal has orientation such that (220) orientation ratio is 33% or less.

17. The device according to claim 11, wherein the first semiconductor layer, the second semiconductor layer, and the third semiconductor layer are each made of the semiconductor of a polycrystal whose crystal grain does not penetrate through its thickness.

18. The device according to claim 11, wherein
the first semiconductor layer is made of a semiconductor of a columnar polycrystal whose crystal grain penetrates through its thickness, and
the second semiconductor layer and the third semiconductor layer are each made of the semiconductor of the polycrystal whose crystal grain does not penetrate through its thickness.

19. The device according to claim 11, wherein
the first semiconductor layer is made of the semiconductor of the polycrystal whose crystal grain does not penetrate through its thickness, and
the second semiconductor layer and the third semiconductor layer are made of a semiconductor of a columnar polycrystal whose crystal grain penetrates through the thickness of the second semiconductor layer and the third semiconductor layer.

20. The device according to claim 19, wherein
the first semiconductor layer, the second semiconductor layer, and the third semiconductor layer each contains silicon, and
a silicon-germanium compound layer is formed in a superficial layer of the third semiconductor layer.

\* \* \* \* \*